United States Patent
Fukuchi

(10) Patent No.: US 10,297,893 B2
(45) Date of Patent: May 21, 2019

(54) HIGH FREQUENCY TRANSMISSION LINE WITH AN OPEN-ENDED STUB

(71) Applicant: Toshiba Memory Corporation, Tokyo (JP)

(72) Inventor: Satoru Fukuchi, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 37 days.

(21) Appl. No.: 15/448,566

(22) Filed: Mar. 2, 2017

(65) Prior Publication Data
US 2018/0254537 A1    Sep. 6, 2018

(51) Int. Cl.
*G11C 5/06* (2006.01)
*H01P 1/207* (2006.01)

(52) U.S. Cl.
CPC .............. *H01P 1/207* (2013.01); *G11C 5/06* (2013.01)

(58) Field of Classification Search
CPC .................................. H01P 1/207; G11C 5/06
See application file for complete search history.

(56) References Cited

U.S. PATENT DOCUMENTS

| 8,270,180 B2 | 9/2012 | Liu et al. |
| 2013/0328645 A1* | 12/2013 | Na ........................ H01P 1/203 333/204 |
| 2016/0066415 A1 | 3/2016 | Kataoka et al. |

FOREIGN PATENT DOCUMENTS

| JP | 2008-091707 A | 4/2008 |
| JP | 4237467 B2 | 3/2009 |
| JP | 2010-081310 A | 4/2010 |

* cited by examiner

*Primary Examiner* — Robert J Pascal
*Assistant Examiner* — Kimberly E Glenn
(74) *Attorney, Agent, or Firm* — Kim & Stewart LLP

(57) ABSTRACT

A circuit includes a conductive layer, an insulation layer on the conductive layer, a transmission line on the insulation layer, the transmission line having a first end and a second end, and a stub on the insulation layer and having a first section of a first constant width connected to the transmission line at a location on the transmission line between the first and second ends, and a second section of a second constant width adjacent to the first section. The first constant width is less than the second constant width.

20 Claims, 11 Drawing Sheets

HIGH FREQUENCY TRANSMISSION LINE WITH AN OPEN-ENDED STUB

BACKGROUND

FIG. 1 shows a circuit 1C of the related art having a high frequency transmission line 103 with an open-ended stub 104P formed on an insulation layer 102. The open-ended stub 104P is branched from the transmission line 103 through which high-frequency signals are transmitted from an input end E1 to an output end E2. FIG. 1 also shows a pad 105 that is formed at the end of the open-ended stub 104P for signal analysis purposes. A signal analysis circuit (not shown) is connected to the pad 105 so that the signal in the transmission line 103 can be acquired through the pad 105 and analyzed using the signal analysis circuit.

Part of the signals transmitted through the open-ended stub 104P is, however, reflected by the end E3 of the open-ended stub 104P. The reflected signal is not desirable because it interferes with and deteriorates the main signal flowing in the transmission line 103 from the input end E1 to the output end E2. Thus, in the related art, in order to reduce the adverse effect of the reflected signal, the length L of the open-ended stub 104P is shortened so as to increase the frequency of the reflected signal because interference from the reflected signal can be acceptable if it is at a high enough frequency. However, because the open-ended stub is provided for analysis purposes as described above, there is a limit on how short the length L of the open-ended stub.

DETAILED DESCRIPTION

A circuit according an embodiment includes a conductive layer, an insulation layer on the conductive layer, a transmission line on the insulation layer, the transmission line having a first end and a second end, and a stub on the insulation layer and having a first section of a first constant width connected to the transmission line at a location on the transmission line between the first and second ends, and a second section of a second constant width adjacent to the first section. The first constant width is less than the second constant width.

A circuit according to another embodiment includes a first insulation layer, a first conductive layer on the first insulation layer, a second insulation layer on the first conductive layer, a second conductive layer on the second insulation layer, a third insulation layer on the second conductive layer, a transmission line on the third insulation layer, the transmission line having a first end and a second end, and a stub on the third insulation layer and having a first section connected to the transmission line at a location on the transmission line between the first and second ends, and a second section adjacent to the first section. The second conductive layer includes a first region made of a conductive material and a second region directly underneath the first section of the stub that is made of an insulating material.

An electronic device according to another embodiment includes a conductive layer, an insulation layer on the conductive layer, a memory chip provided on the insulation layer, a controller configured to control the memory chip, a transmission line on the insulation layer, the transmission line connecting the memory chip and the controller, and a stub on the insulation layer and having a first section of a first constant width connected to the transmission line at a location on the transmission line between the memory chip and the controller, and a second section of a second constant width adjacent to the first section. The first constant width is less than the second constant width.

A circuit according to a first embodiment is explained with reference to FIGS. 2 to 6. The circuit according to the first embodiment can be, for example, a printed circuit or semiconductor circuit. In this embodiment, the printed circuit is exemplified as the circuit according to the first embodiment.

Figure 2:
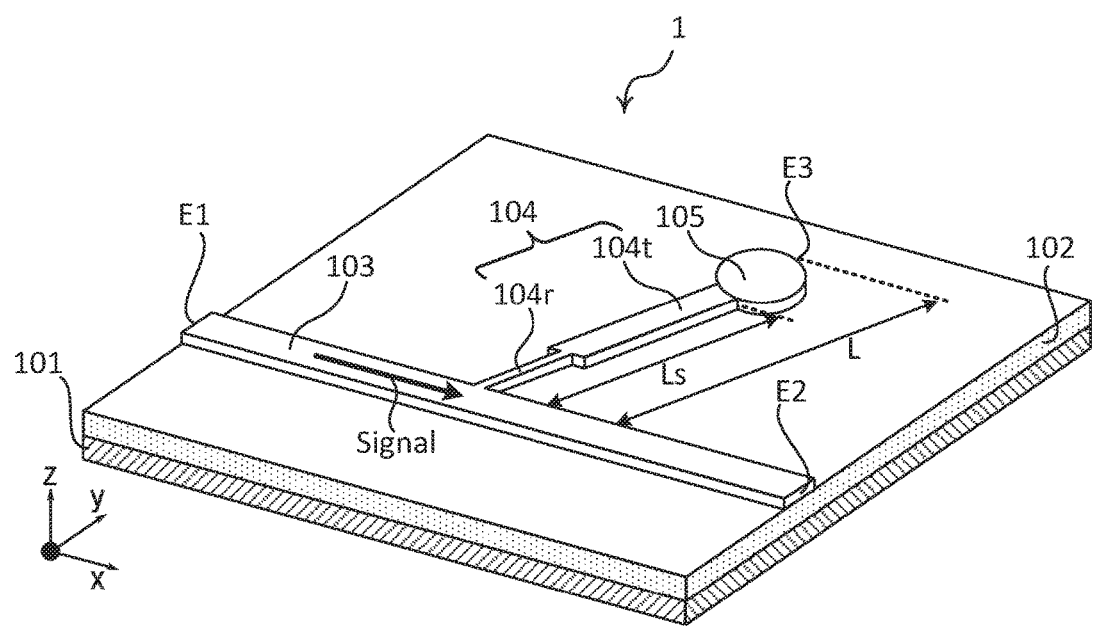
FIG. 2 is a partial schematic perspective view of a circuit having a high frequency transmission line with an open-ended stub, according to a first embodiment.
Figure 3:
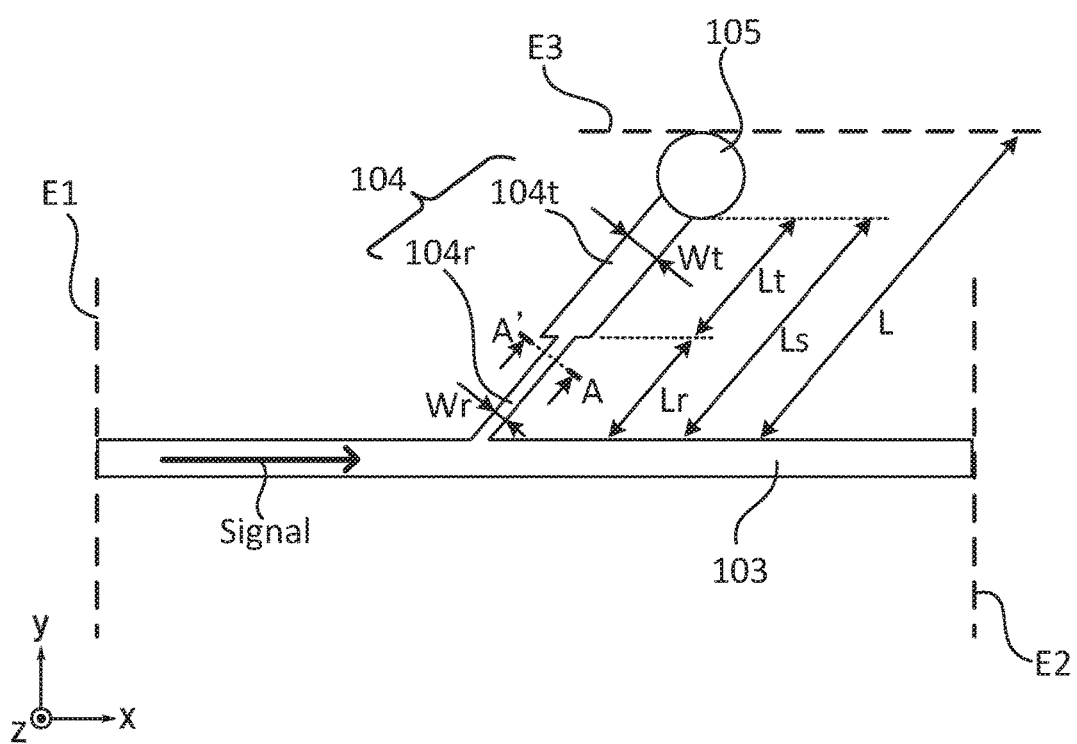
FIG. 3 is a partial schematic plane view of the circuit shown in FIG. 2.
Figure 4:
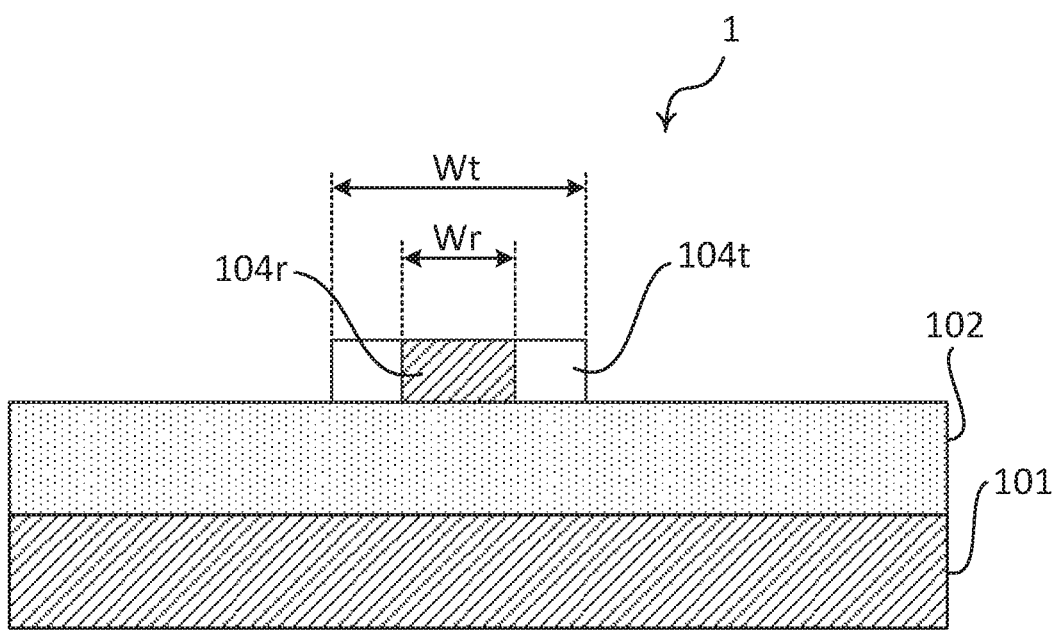
FIG. 4 illustrates a partial cross-section taken along line A-A' in FIG. 3.

FIG. 2 is a partial schematic perspective view of a circuit 1 having a high frequency transmission line 103 with an open-ended stub 104, according to a first embodiment. In FIG. 2, X, Y, and Z axes are axes orthogonal to one another. The Z axis is an axis corresponding to an up-to-down direction of the circuit 1. A relation among the three axes X, Y, and Z is the same in the other drawings. FIG. 3 is a partial schematic plane view of the circuit 1 shown in FIG. 2. FIG. 4 illustrates a partial cross-section taken along line A-A' in FIG. 3.

A circuit 1 includes a conductive layer 101, an insulation layer 102 on the conductive layer 101, a transmission line 103 on the insulation layer 102, an open-ended stub 104 on the insulation layer 102, and a pad 105 on the insulation layer 102.

The conductive layer 101 is a layer extending in a plane direction including both the X-axis and the Y-axis. The conductive layer 101 can be formed with conductive material such as copper (Cu). In the embodiments, the conductive layer may be a power source layer or a ground layer.

The insulation layer 102 is a layer formed on the conductive layer 101. The insulation layer 102 is formed with, for example, glass epoxy substrate (e.g., FR4). The glass-epoxy substrate includes glass cloth and epoxy resin layers.

The transmission line 103 is formed on the insulation layer 102. The transmission line 103 extends linearly along the X-axis direction (first direction). The transmission line 103 is a high-frequency signal line through which high-frequency signals (e.g., equal to or higher than 100 MHz) are transmitted from an input end E1 to an output end E2.

The open-ended stub 104 is also formed on the insulation layer 102 and is branched from the transmission line 103. The open-ended stub 104 extends linearly along a direction (second direction) that is non-perpendicular with respect to the X-axis direction. However, in other embodiments, the open-ended stub 104 may extend linearly along a direction that is perpendicular with respect to the X-axis direction.

The open-ended stub 104 has two sections, a first section 104r and a second section 104t. The pad 105 is formed at the end of the open-ended stub 104. A signal analysis circuit (not shown) can be connected to the pad 105 so that the signal in the transmission line 103 can be acquired through the pad 105 and analyzed using the signal analysis circuit. The transmission line 103, the open-ended stub 104, and the pad 105 are formed with conductive material, such as copper (Cu).

The length L shown in FIGS. 2 and 3 represents the length that is dictated by the circuit design. In this embodiment, because of some limitation dictated by the circuit design, it is assumed that it is difficult to make the length shorter than the length L shown in FIGS. 2 and 3. It should be understood that the length L, in other embodiments, may be longer or shorter than the specific length depicted in FIGS. 2 and 3.

As shown in FIG. 3, the length L is a sum of the lengths of the first section 104r, the second section 104t, and the pad 105. According to one embodiment, the length Lt of the second section 104t is longer than the length Lr of the first section 104r. In other embodiments, the length Lt of the second section 104t may be equal to or shorter than the length Lr of the first section 104r. In addition, a width Wr of the first section 104r is narrower than a width Wt of the second section 104t (see also FIG. 4).

The characteristic impedance $Z_0$ can be obtained based on the following formula (1).

$$Z_0 \approx \sqrt{\frac{L}{c}} \quad (1)$$

In the formula (1), L is the inductance per unit length, and C is the capacitance per unit length.

Further, the capacitance C is obtained based on the following formula (2).

$$C = \varepsilon_r \frac{S}{d} \quad (2)$$

In the formula (2), $\varepsilon_r$ is the relative static permittivity of the insulation layer, S is the area of the conductor facing the other conductor through the insulation layer and d is the distance between the conductors. When calculating the characteristic impedance $Z_0$ of the first section 104r using the formula (2), $\varepsilon_r$ is the relative static permittivity of the insulation layer 102, S is the area of the first section 104r facing the conductive layer 101 through the insulation layer 102 and d is the distance between the first section 104r and the conductive layer 101 in a depth direction (Z-axis direction).

By narrowing the width Wr of the first section 104r relative to the width Wt of the second section 104t, the area S of the first section 104r facing the conductive layer 101 through the insulation layer 102 becomes narrower. As a result of narrowing the area S of the first section 104r, capacitance C of the first section 104r becomes smaller. The characteristic impedance of the first section 104r becomes higher than a case where the first section 104r has a width which is the same as the width Wt of the second section 104t. That is, the characteristic impedance of the first section 104r in the first embodiment becomes higher as result of the narrowed width.

By increasing the characteristic impedance of the first section 104r, the frequency of the signal reflected by the end E3 of the open-ended stub 104 becomes higher. By increasing the frequency of the reflected signal, the interference effects of the reflected signal on the main signal flowing from the input end E1 to the output end E2 can be reduced. By reducing the interference effects, the transmission characteristics of the main signal can be improved as shown in FIG. 6.

Figure 5:
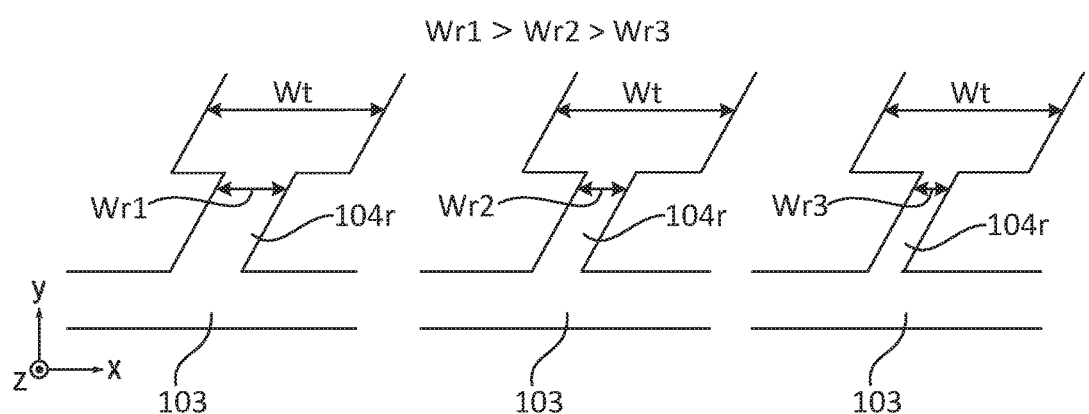
FIG. 5 is a diagram depicting different examples of the open-ended stub.

FIG. 5 is a diagram depicting different examples of the open-ended stub. In FIG. 5, the width Wr1 of the first section 104r is wider than the width Wr2 of the first section 104r. The width Wr2 of the first section 104r is wider than the width Wr3 of the first section 104r. That is, the relationship between the width Wr1, Wr2 and Wr3 is as following formula (3).

$$Wr1 > Wr2 > Wr3 \quad (3)$$

Figure 6:
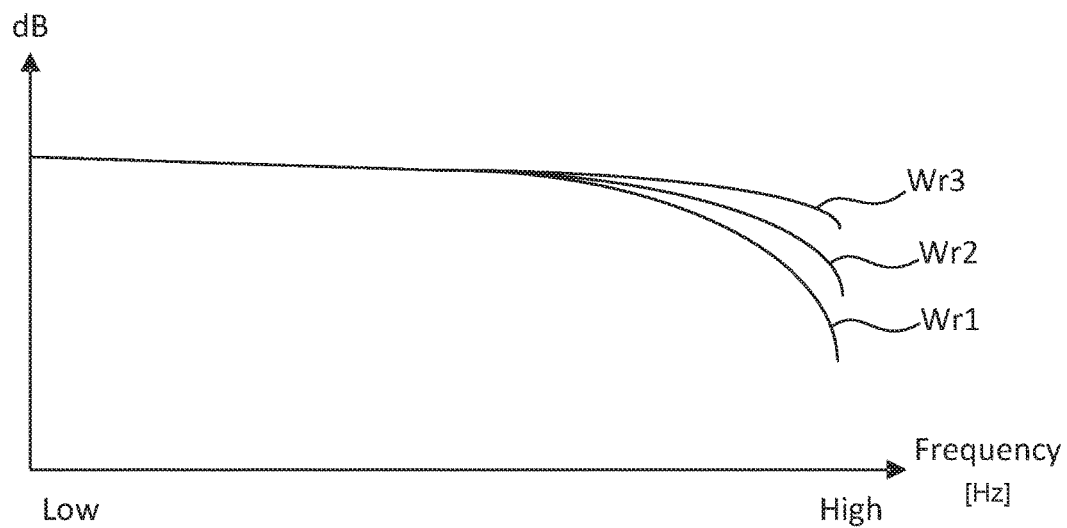
FIG. 6 is a graph showing the transmission characteristics of each of the examples of the open-ended stub depicted in FIG. 5.

FIG. 6 is a graph showing the transmission characteristics of each of the examples of the open-ended stub depicted in FIG. 5. The vertical axis represents the attenuation of the transmitted signal in decibels [dB] and the horizontal axis represents different frequencies. As shown in FIG. 6, at high frequencies, the open-ended stub having the narrowest width, i.e., width Wr3, attenuates the transmitted signal by the least amount. In general, as the width of the first section 104r becomes narrower, the attenuation of the transmitted signal at higher frequencies becomes lesser. However, the width of the first section 104r should not decreased too much as it would increase the characteristic impedance too much and not allow enough signal to reach the pad 105 for analysis purposes.

According to the first embodiment, even when it is difficult to make the length of the open-ended stub shorter because of design limitations, it is still possible to increase the frequency of the reflected signal and reduce the deterioration of main signal.

A circuit according to a second embodiment of the present invention is explained with reference to FIGS. 7 to 9.

In the following description of the second embodiment, components having functions same as those explained in the first embodiment are denoted by the same reference numerals and signs, and explanation of such components is repeated as needed.

Figure 7:
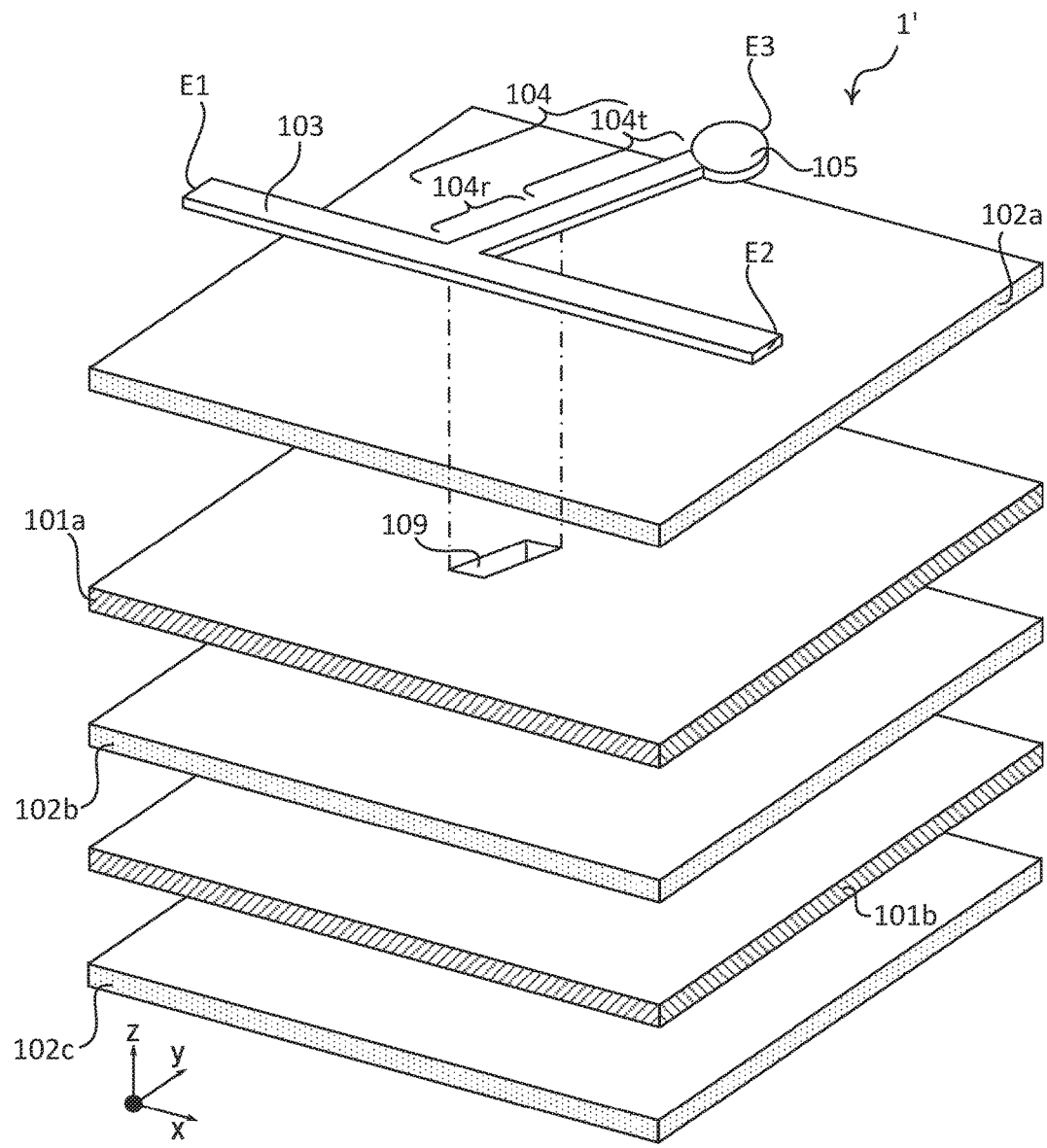
FIG. 7 is a partial exploded perspective view of a circuit having a high frequency transmission line with an open-ended stub, according to a second embodiment.

FIG. 7 is a partial exploded perspective view of a circuit 1' having a high frequency transmission line 103 with an open-ended stub 104, according to the second embodiment. FIG. 8 is a partial schematic plane view of the circuit 1'. FIG. 9 illustrates a partial cross-section taken along line B-B' in FIG. 8.

A circuit 1' includes an insulation layer 102c, a first conductive layer 101b on the insulation layer 102c, an insulation layer 102b on the first conductive layer 101b, a second conductive layer 101a on the insulation layer 102b, an insulation layer 102a on the second conductive layer 101a, a transmission line 103 on the insulation layer 102a, an open-ended stub 104 on the insulation layer 102a, and a pad 105 on the insulation layer 102a.

In the present embodiment, the first conductive layer can be, for example, power source layer, and the second conductive layer can be, for example, ground layer. However, the above configuration is not limiting. That is, one of the first conductive layer and the second conductive layer can be the power source layer and the other can be the ground layer. Further, both the first conductive layer and the second conductive layer can be either one of the power source layer and the ground layer.

The insulation layer 102c is a layer extending in a plane direction including both the X-axis and the Y-axis.

The first conductive layer 101b is a layer formed on the insulation layer 102c. The entire first conductive layer 101b is made of conductive material.

The insulation layer 102b is a layer formed on the first conductive layer 101b.

The second conductive layer 101a is a layer formed on the insulation layer 102b. The second conductive layer 101a can be formed with conductive material such as copper (Cu). The entire second conductive layer 101a is made of conductive material except for the portion that is directly below the first section 104r of the open-ended stub 104.

The insulation layer 102a is a layer formed on the second conductive layer 101a. The insulation layers 102a to 102c are formed with, for example, glass epoxy substrate (e.g., FR4). The glass-epoxy substrate includes glass cloth and epoxy resin layers.

The transmission line 103 is formed on the insulation layer 102a. The transmission line 103 is a high-frequency signal line through which high-frequency signals (e.g., equal to or higher than 100 MHz) are transmitted from an input end E1 to an output end E2. The open-ended stub 104 is also formed on the insulation layer 102a and is branched from the transmission line 103. The open-ended stub 104 has two sections, a first section 104r and a second section 104t. The pad 105 is formed at the end of the open-ended stub 104. A signal analysis circuit (not shown) can be connected to the pad 105 so that the signal in the transmission line 103 can be acquired through the pad 105 and analyzed using the signal analysis circuit.

The transmission line 103, the open-ended stub 104 and the pad 105 are formed with conductive material, such as copper (Cu).

Figure 8:
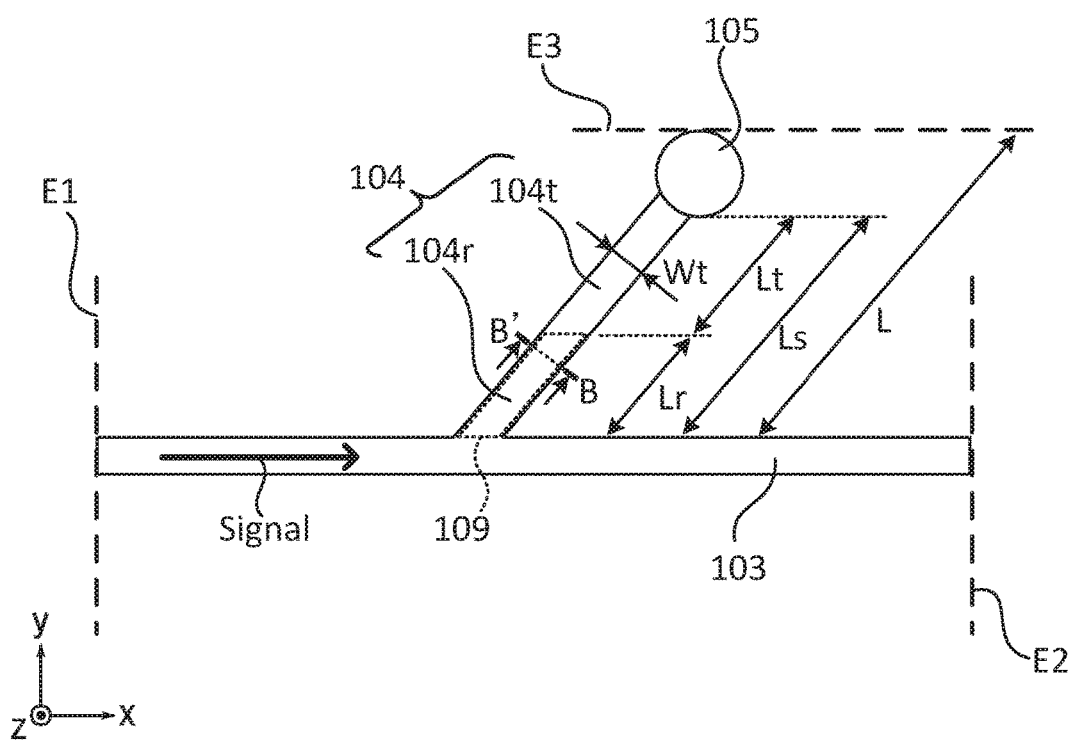
FIG. 8 is a partial schematic plane view of the circuit shown in FIG. 7.

The length L shown in FIG. 8 represents the length that is dictated by the circuit design. In this embodiment, because of some limitation directed by the circuit design, it is assumed that it is difficult to make the length shorter than the length L shown in FIG. 8. It should be understood that the length L, in other embodiments, may be longer or shorter than the specific length depicted in FIG. 8.

Figure 1:
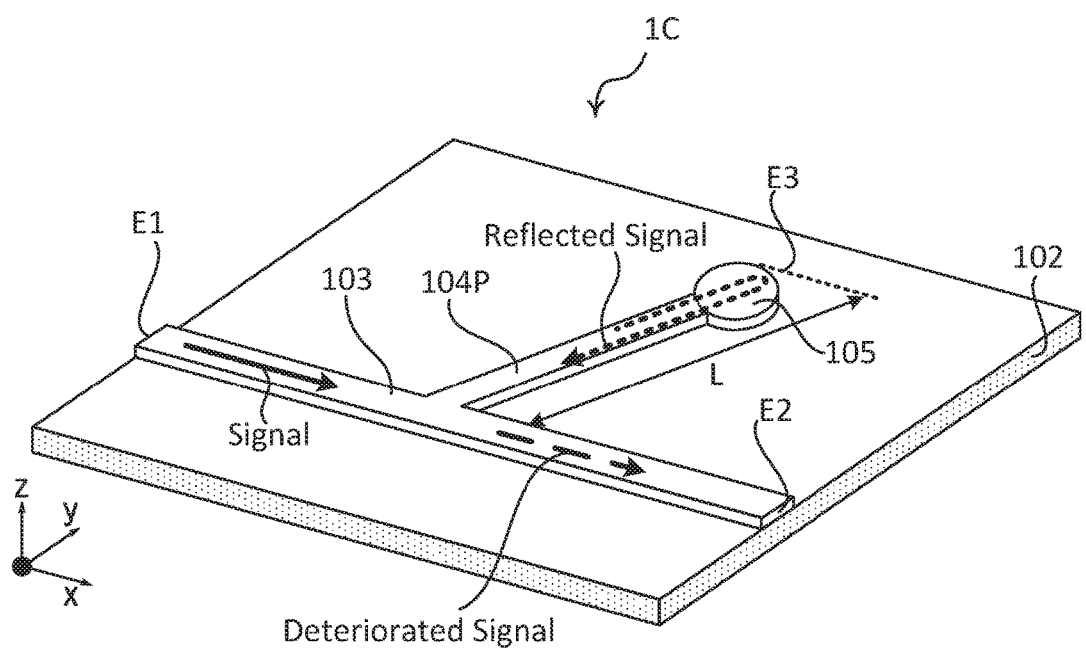
FIG. 1 is a partial schematic perspective view of a conventional circuit having a high frequency transmission line with an open-ended stub.

As shown in FIG. 8, the length L is a sum of the lengths of the first section 104r, the second section 104t, and the pad 105. According to embodiments, the length Lt of the second section 104t is longer than the length Lr of the first section 104r. In other embodiments, the length Lt of the second section 104t may be equal to or shorter than the length Lr of the first section 104r. A width of the first section 104r is same as a width Wt of the second section 104t (FIG. 8). That is, in the second embodiment, the structure of the transmission line 103 and the open-ended stub 104 can be same as the conventional structure shown in FIG. 1.

Figure 9:
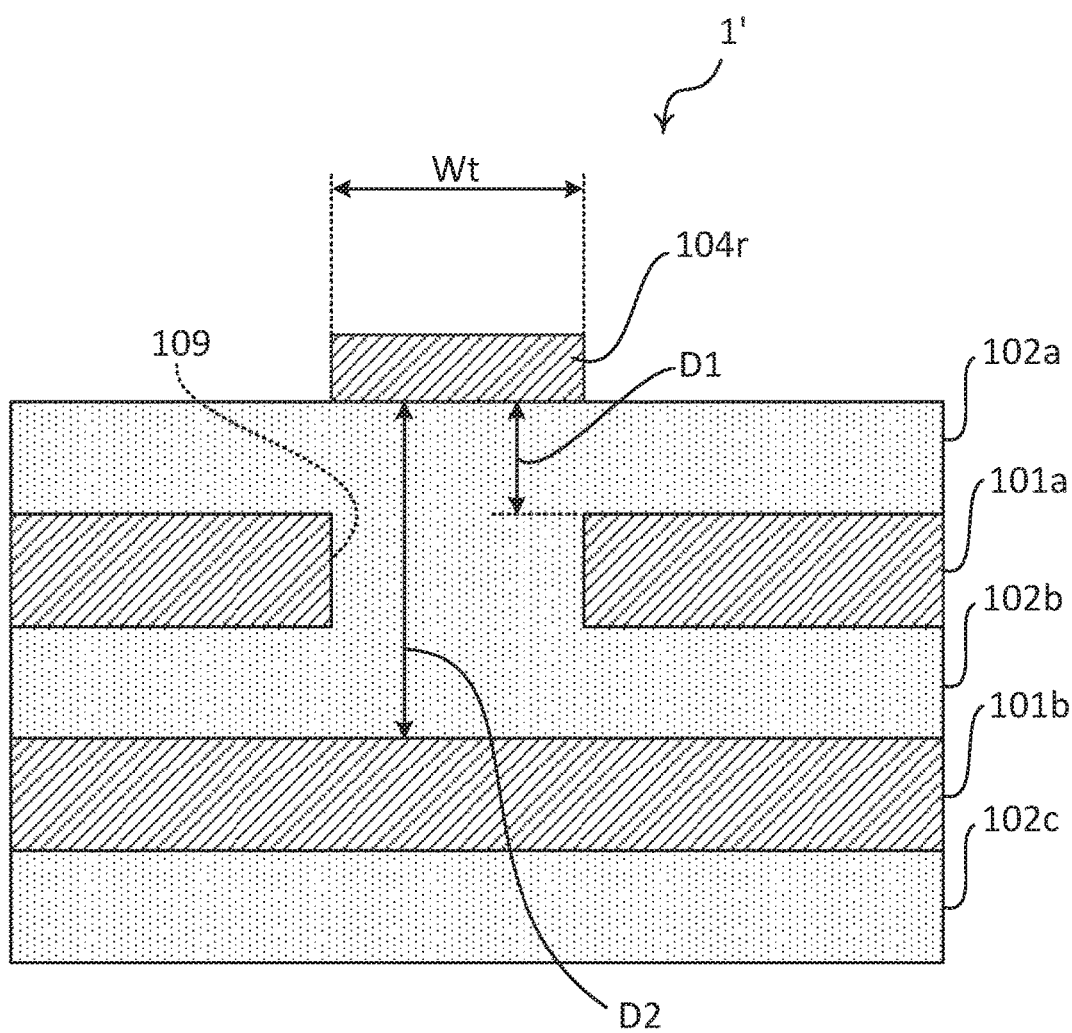
FIG. 9 illustrates a partial cross-section taken along line B-B' in FIG. 8.

Instead of narrowing the width of the first section 104r of the open-ended stub 104, in the second embodiment, a through-hole 109 is formed in the second conductive layer 101a at a portion corresponding to at least a part of the first section 104r as shown in FIGS. 7 and 9. The region in the through-hole 109 is filled with the insulating material which may be the same material as that of the insulation layer 102a. That is, the area (second region) directly underneath the first section 104r of the open-ended stub 104 is made of an insulating material. As a modification, the region in the through-hole 109 may be an air gap.

As shown in FIGS. 7 and 9, the second section 104t faces the second conductive layer 101a through the insulation layer 102a in a depth direction (Z-axis direction). Further, at least a part of the first section 104r faces the first conductive layer 101b through the through-hole 109 and the insulation layers 102a and 102b.

The characteristic impedance $Z_0$ can be obtained based on the following formula (1).

$$Z_0 \approx \sqrt{\frac{L}{c}} \quad (1)$$

In the formula (1), L is the inductance per unit length, and C is the capacitance per unit length.

Further, the capacitance C is obtained based on the following formula (2).

$$C = \varepsilon_r \frac{S}{d} \quad (2)$$

In the formula (2), $\varepsilon_r$ is the relative static permittivity of the insulation layer, S is the area of the conductor facing the other conductor through the insulation layer and d is the distance between the conductors. When calculating the characteristic impedance $Z_0$ of the first section 104r using the formula (2), $\varepsilon_r$ is the relative static permittivity of the insulation layer 102, S is the area of the first section 104r facing the conductive layer, such as the second conductive layer 101a and the first conductive layer 101b, through the insulation layer 102 and d is the distance between the first section 104r and the conductive layer, such as the second conductive layer 101a and the first conductive layer 101b, in a depth direction (Z-axis direction).

In this embodiment, to simplify the explanation, the position and the area of the through-hole 109 that is filled with insulating material is the same as those of the first section 104r. Therefore, S represents both the area of the first section 104r and the area of the through-hole 109. However, it is not necessary to make the positions and areas in the plane direction of the first section 104r and the through-hole 109 the same. Effects of the second embodiment can still be obtained for small variations in the positions and the areas, e.g., the centers are offset in the length direction of the first section 104r and in the width direction of the first section 104r.

By forming the through-hole 109 in the second conductive layer 101a at a portion corresponding to at least a part of the first section 104r as shown in FIG. 7, and filling the through-hole 109 with insulating material, the distance in the Z-axis direction between such part of the first section 104r and a conductive layer, which is now the first conductive layer 101b as a result of removing the second conductive layer 101a, is increased from distance D1 to distance D2. That is, the characteristic impedance of the first section 104r in the second embodiment becomes higher as result of the increased distance. By increasing the characteristic impedance of the first section 104r, the frequency of the signal reflected by the end E3 of the open-ended stub 104 becomes higher. By increasing the frequency of the reflected signal, the interference effects of the reflected signal on the main signal flowing from the input end E1 to the output end E2 can be reduced. By reducing the interference effects, the transmission characteristics of the main signal can be improved as shown in FIG. 6.

The above embodiments present two solutions to reduce the deterioration in the main signal transmitted from the input end E1 to the output end E2. The two solutions may be applied separately or combined to reduce the deterioration of main signal transmission transmitted from the input end E1 to the output end E2.

A circuit according to a third embodiment of the present invention is explained with reference to FIG. 10.

In the following description of the third embodiment, components having functions same as those explained in the first embodiment are denoted by the same reference numerals and signs, and explanation of such components is repeated as needed.

Figure 10:
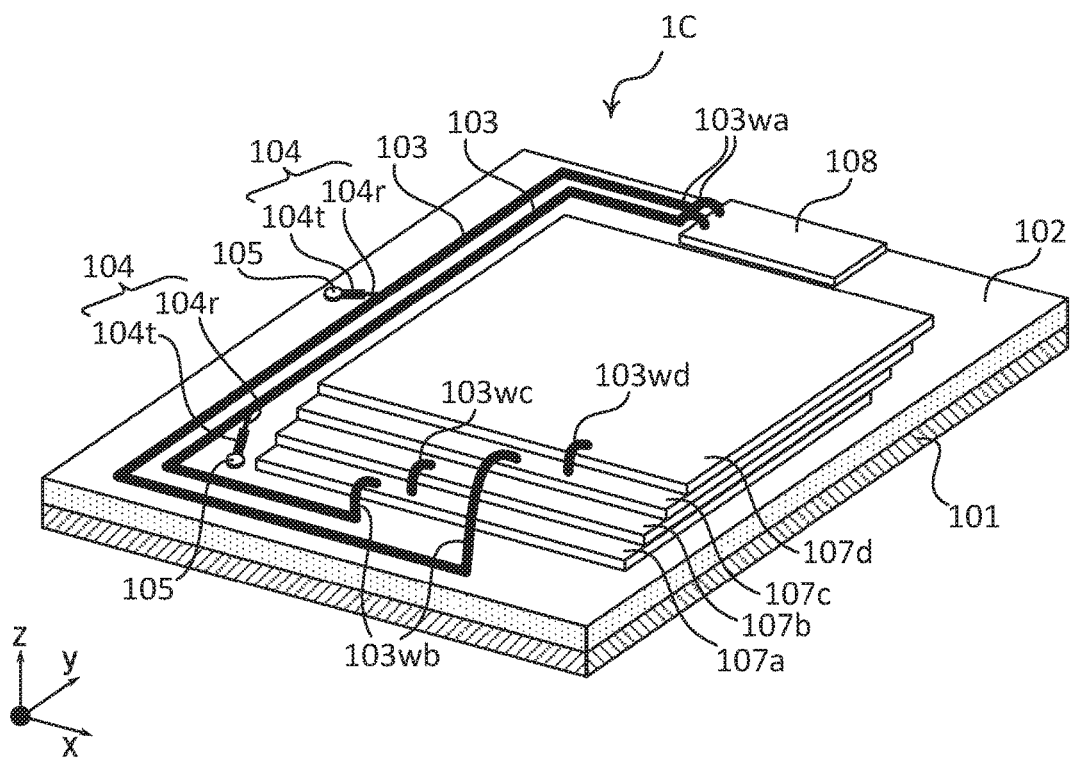
FIG. 10 is a partial schematic perspective view of an electronic device having a high frequency transmission line with an open-ended stub, according to a third embodiment.

FIG. 10 is a partial schematic perspective view of an electronic device 1C having a high frequency transmission line with an open-ended stub, according to the third embodiment. An electronic device 1C is, for example, a BGA (ball grid array) SSD (solid state drive) memory device.

An electronic device 1C includes a conductive layer 101, an insulation layer 102 formed on the conductive layer 101, NAND chips 107a-107d stacked on the insulation layer 102, a controller 108 provided on the insulation layer 102, transmission lines 103, wires 103wa, 103wb, 103wc and 103wd, open-ended stubs 104, and pads 105.

The conductive layer 101 is a layer extending in a plane direction including both the X-axis and the Y-axis. The conductive layer 101 can be formed with conductive material such as copper (Cu).

The insulation layer 102 is a layer formed on the conductive layer 101. The insulation layer 102 is formed with, for example, glass epoxy substrate (e.g., FR4). The glass-epoxy substrate includes glass cloth and epoxy resin layers.

In the present embodiment, four NAND chips 107a-107d are stacked on the insulation layer 102 so that adjacent NAND chips are shifted each other in the Y-axis direction (offset stacking).

The transmission lines 103 are formed on the insulation layer 102. The transmission lines 103 extend around the NAND chips 107a-107d to connect the controller 108 and the NAND chips. The transmission lines 103 are high-frequency signal lines through which high-frequency signals (e.g., equal to or higher than 100 MHz) are transmitted between the controller 108 and the NAND chips. One ends of transmission lines 103 are connected to the controller 108 with wires 103wa by wire-bonding process as shown in FIG. 10. On the other hand, the other ends of the transmission lines 103 are connected to the NAND chips 107a and 107c with wires 103wb by the wire-bonding process. Further, the NAND chips 107a and 107b are connected with a wire 103wc by the wire-bonding process. The NAND chips 107c and 107d are connected with a wire 103wd by the wire-bonding process.

The open-ended stubs 104 are also formed on the insulation layer 102 and are branched from the transmission lines 103 respectively. The open-ended stubs 104 extend linearly along a direction that is non-perpendicular with respect to a portion of the transmission line 103 to which the open-ended stub 104 is connected. However, in other embodiments, the open-ended stubs 104 may extend linearly along a direction that is perpendicular with respect to the portion of the transmission line 103 to which the open-ended stub 104 is connected.

Each open-ended stub 104 has two sections, a first section 104r and a second section 104t. The pad 105 is formed at the end of the open-ended stub 104. A signal analysis circuit (not shown) can be connected to the pad 105 so that the signal in the transmission line 103 can be acquired through the pad 105 and analyzed using the signal analysis circuit. The transmission line 103, the wires 103wa, 103wb, 103wc and 103wd, the open-ended stub 104, and the pad 105 are formed with conductive material, such as copper (Cu).

In the present embodiment, the conductive layer 101 can be, for example, power source layer, or ground layer.

According to embodiments, the length of the second section 104t is longer than the length of the first section 104r. In other embodiments, the length of the second section 104t may be equal to or shorter than the length of the first section 104r. In addition, a width of the first section 104r is narrower than a width of the second section 104t (FIG. 10).

In the present embodiment, by narrowing the width of the first section 104r relative to the width of the second section 104t, the characteristic impedance of the first section 104r becomes higher as result of the narrowed width for the same reason as explained with respect to the first embodiment.

A circuit according to a fourth embodiment of the present invention is explained with reference to FIG. 11.

In the following description of the fourth embodiment, components having functions same as those explained in the second embodiment are denoted by the same reference numerals and signs, and explanation of such components is repeated as needed.

Figure 11:
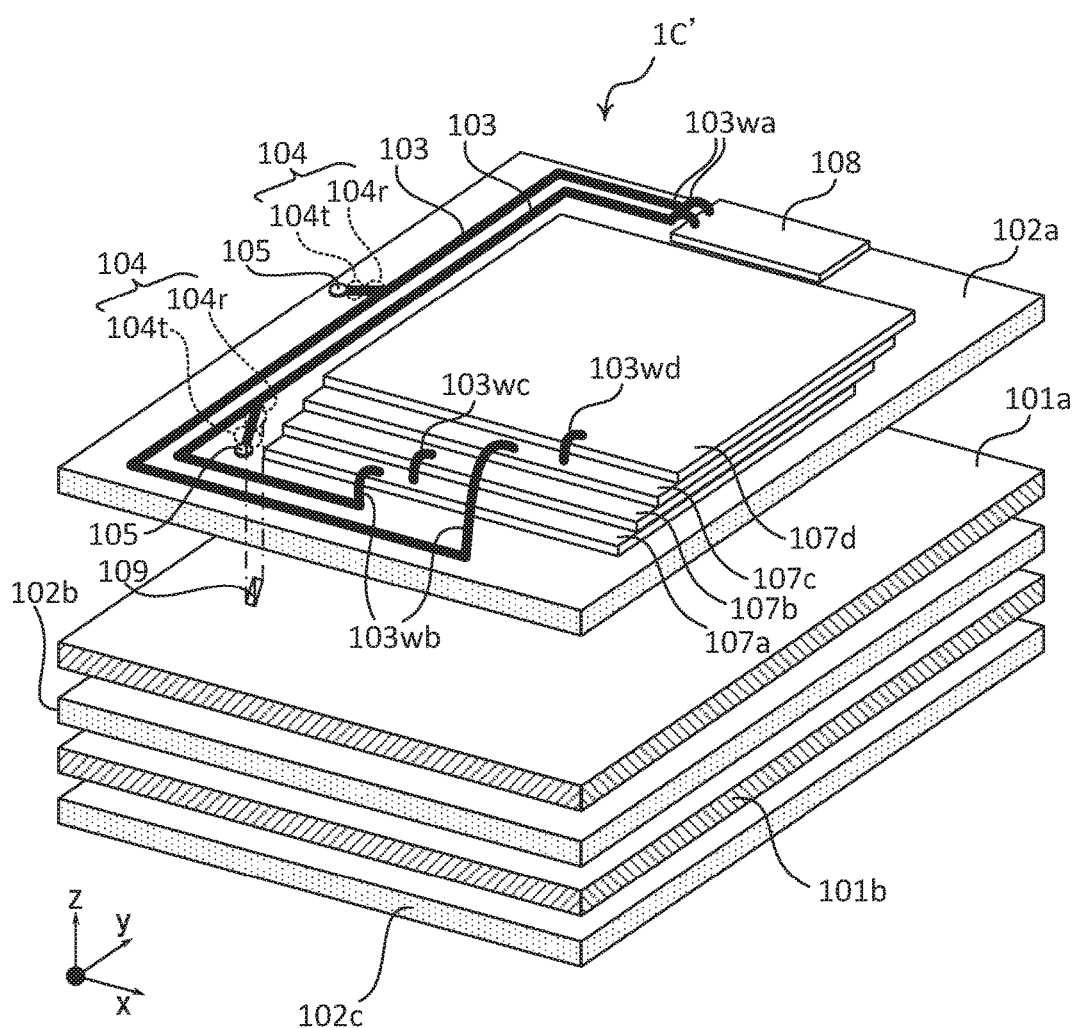
FIG. 11 is a partial exploded schematic perspective view of an electronic device having a high frequency transmission line with an open-ended stub, according to a fourth embodiment.

FIG. 11 is a partial exploded schematic perspective view of an electronic device 1C' having a high frequency transmission line with an open-ended stub, according to the fourth embodiment. An electronic device 1C' is, for example, a BGA (ball grid array) SSD (solid state drive) memory device.

An electronic device 1C' includes an insulation layer 102c, a first conductive layer 101b on the insulation layer 102c, an insulation layer 102b on the first conductive layer 101b, a second conductive layer 101a on the insulation layer 102b, an insulation layer 102a on the second conductive layer 101a, NAND chips 107a-107d stacked on the insulation layer 102a, a controller 108 provided on the insulation layer 102a, transmission lines 103 formed on the insulation layer 102a, wires 103wa, 103wb, 103wc and 103wd, open-ended stubs 104 on the insulation layer 102a, and pads 105 on the insulation layer 102a.

In the present embodiment, the first conductive layer can be, for example, power source layer, and the second conductive layer can be, for example, ground layer. However, it is not necessary to be limited to the above configuration. That is, one of the first conductive layer and the second conductive layer can be the power source layer and the other can be the ground layer. Further, both the first conductive layer and the second conductive layer can be either one of the power source layer and the ground layer.

The insulation layer 102c is a layer extending in a plane direction including both the X-axis and the Y-axis.

The first conductive layer 101b is a layer formed on the insulation layer 102c. The entire first conductive layer 101b is made of conductive material.

The insulation layer 102b is a layer formed on the first conductive layer 101b.

The second conductive layer 101a is a layer formed on the insulation layer 102b. The second conductive layer 101a can be formed with conductive material such as copper (Cu). The entire second conductive layer 101a is made of conductive material except for the portion that is directly below the first sections 104r of the open-ended stubs 104.

The insulation layer 102a is a layer formed on the second conductive layer 101a. The insulation layers 102a to 102c are formed with, for example, glass epoxy substrate (e.g., FR4). The glass-epoxy substrate includes glass cloth and epoxy resin layers.

In the present embodiment, four NAND chips 107a-107d are stacked on the insulation layer 102a so that adjacent NAND chips are shifted each other in the Y-axis direction (offset stacking).

The transmission lines 103 are formed on the insulation layer 102a. The transmission lines 103 extend around the NAND chips 107a-107d to connect the controller 108 and the NAND chips. The transmission lines 103 are high-frequency signal lines through which high-frequency signals (e.g., equal to or higher than 100 MHz) are transmitted between the controller 108 and the NAND chips. One ends of transmission lines 103 are connected to the controller 108 with wires 103wa by wire-bonding process as shown in FIG. 11. On the other hand, the other ends of the transmission lines 103 are connected to the NAND chips 107a and 107c with wires 103wb by the wire-bonding process. Further, the NAND chips 107a and 107b are connected with a wire 103wc by the wire-bonding process. The NAND chips 107c and 107d are connected with a wire 103wd by the wire-bonding process.

The open-ended stubs 104 are also formed on the insulation layer 102a and are branched from the transmission lines 103 respectively. The open-ended stubs 104 extend linearly along a direction that is non-perpendicular with respect to a portion of the transmission line 103 to which the open-ended stub 104 is connected. However, in other embodiments, the open-ended stubs 104 may extend linearly along a direction that is perpendicular with respect to the portion of the transmission line 103 to which the open-ended stub 104 is connected.

Each open-ended stub 104 has two sections, a first section 104r and a second section 104t. The pad 105 is formed at the end of the open-ended stub 104. A signal analysis circuit (not shown) can be connected to the pad 105 so that the signal in the transmission line 103 can be acquired through the pad 105 and analyzed using the signal analysis circuit. The transmission line 103, the wires 103wa, 103wb, 103wc and 103wd, the open-ended stub 104, and the pad 105 are formed with conductive material, such as copper (Cu).

Instead of narrowing the width of the first section 104r of the open-ended stub 104, in the fourth embodiment, through-holes 109 are formed in the second conductive layer 101a at portions corresponding to at least a part of the first sections 104r as shown in FIG. 11. The regions in the through-holes 109 are filled with the insulating material which may be the same material as that of the insulation layer 102a. That is, the area (second region) directly underneath the first section 104r of the open-ended stub 104 is made of an insulating material. As a modification, the region in the through-hole 109 may be an air gap.

As shown in FIG. 11, the second section 104t faces the second conductive layer 101a through the insulation layer 102a in a depth direction (Z-axis direction). Further, at least a part of the first section 104r faces the first conductive layer 101b through the through-hole 109 and the insulation layers 102a and 102b.

In this embodiment, to simplify the explanation, the position and the area of the through-hole 109 that is filled with insulating material is the same as those of the first section 104r. However, it is not necessary to make the positions and areas in the plane direction of the first section 104r and the through-hole 109 the same. Effects of the second embodiment can still be obtained for small variations in the positions and the areas, e.g., the centers are offset in the length direction of the first section 104r and in the width direction of the first section 104r.

By forming the through-hole 109 in the second conductive layer 101a at a portion corresponding to at least a part of the first section 104r as shown in FIG. 11, and filling the through-holes 109 with insulating material, the distance in the Z-axis direction between such part of the first section 104r and a conductive layer, which is now the first conductive layer 101b as a result of removing the second conductive layer 101a, is increased. That is, the characteristic impedance of the first section 104r in the fourth embodiment becomes higher as result of the increased distance from the same reason in the second embodiment. By increasing the characteristic impedance of the first section 104r, the frequency of the signal reflected by the end of the open-ended stub 104 becomes higher. By increasing the frequency of the reflected signal, the interference effects of the reflected signal on the main signal flowing in the transmission line 103 can be reduced. By reducing the interference effects, the transmission characteristics of the main signal can be improved as shown in FIG. 6.

The above two solutions (narrowing the width of the first section, and forming the through-hole in the second conductive layer at a portion corresponding to the first section) may be applied separately or combined to reduce the deterioration of main signal transmission transmitted in the transmission line 103 in the electronic device according to the third and fourth embodiments.

In the above embodiments, in a case where the circuit is the semiconductor circuit, the conductive layers, the transmission line, the open-ended stub and the pad can be formed with conductive material such as copper (Cu), gold (Au) or aluminum (Al). Similarly, in a case where the circuit is the semiconductor circuit, the insulation layer can be formed with, for example, silicon dioxide ($SiO_2$), silicon nitride (SiN) or a high-κ dielectric material, such as hafnium (IV) oxide ($HfO_2$), aluminum oxide ($Al_2O_3$) or aluminum nitride (AlN).

Embodiments can be carried out in various forms without departing from main characteristics thereof. The embodiments are merely exemplars in every aspect and should not be limitedly interpreted. The scope of the present invention is indicated by the scope of claims. The text of the specification does not restrict the scope of the invention. All variations and various improvements, alterations, and modifications belonging to the scope of equivalents of the scope of claims are within the scope of the present invention.

What is claimed is:

1. A circuit comprising:
   a first insulation layer;
   a first conductive layer on the first insulation layer;
   a second insulation layer on the first conductive layer;
   a second conductive layer on the second insulation layer;
   a third insulation layer on the second conductive layer;
   a transmission line on the third insulation layer, the transmission line having a first end and a second end; and
   a stub on the third insulation layer and having a first section connected to the transmission line at a location on the transmission line between the first and second ends, and a second section adjacent to the first section, wherein the second conductive layer includes a first region made of a conductive material and a second region directly underneath the first section of the stub that is made of an insulating material, and the conductive material is copper and the insulating material is one of silicon dioxide, silicon nitride, and high-K dielectric material.

2. The circuit of claim 1, wherein the second conductive layer is made entirely of copper except for the second region.

3. The circuit of claim 1, wherein the third insulation layer is made of one of glass epoxy material, silicon dioxide, silicon nitride, a high-κ dielectric material.

4. The circuit of claim 1, further comprising a signal analysis pad connected to an open end of the second section.

5. The circuit of claim 1, wherein the first and second sections have the same constant width.

6. The circuit of claim 5, wherein the transmission line has a constant width that is equal to the constant width of the first and second sections.

7. The circuit of claim 1, wherein the transmission line extends linearly along a first direction and the stub extends linearly along a second direction that is non-perpendicular with respect to the first direction.

8. The circuit of claim 1, wherein the transmission line is a high-frequency signal transmission line configured to transmit a signal having a frequency of equal to or higher than 100 MHz.

9. The circuit of claim 8, wherein the transmission line is configured to transmit an electrical signal.

10. The circuit of claim 9, wherein the transmission line is made of metal.

11. An electronic device comprising:
a first insulation layer;
a first conductive layer on the first insulation layer;
a second insulation layer on the first conductive layer;
a second conductive layer on the second insulation layer;
a third insulation layer on the second conductive layer;
a memory chip provided on the third insulation layer;
a controller configured to control the memory chip;
a transmission line on the third insulation layer, the transmission line connecting the memory chip and the controller; and
a stub on the third insulation layer and having a first section connected to the transmission line at a location on the transmission line between the memory chip and the controller, and a second section adjacent to the first section, wherein the second conductive layer includes a first region made of a conductive material and a second region directly underneath the first section of the stub that is made of an insulating material, and the conductive material is copper and the insulating material is one of silicon dioxide, silicon nitride, and high-κ dielectric material.

12. The electronic device of claim 11, wherein the second conductive layer is made entirely of copper except for the second region.

13. The electronic device of claim 11, wherein the third insulation layer is made of one of glass epoxy material, silicon dioxide, silicon nitride, a high-κ dielectric material.

14. The electronic device of claim 11, further comprising a signal analysis pad connected to an open end of the second section.

15. The electronic device of claim 11, wherein the first and second sections have the same constant width.

16. The electronic device of claim 15, wherein the transmission line has a constant width that is equal to the constant width of the first and second sections.

17. The electronic device of claim 11, wherein the transmission line extends linearly along a first direction and the stub extends linearly along a second direction that is non-perpendicular with respect to the first direction.

18. The electronic device of claim 11, wherein the transmission line is a high-frequency signal transmission line configured to transmit a signal having a frequency of equal to or higher than 100 MHz.

19. The electronic device of claim 18, wherein the transmission line is configured to transmit an electrical signal.

20. The electronic device of claim 19, wherein the transmission line is made of metal.

* * * * *